(12) United States Patent
Huang et al.

(10) Patent No.: US 11,094,914 B2
(45) Date of Patent: Aug. 17, 2021

(54) DISPLAY PANEL AND MANUFACTURING METHOD THEREOF, DISPLAY DEVICE

(71) Applicant: WuHan TianMa Micro-electronics CO.,LTD, Wuhan (CN)

(72) Inventors: Dan Huang, Wuhan (CN); Jun Yan, Wuhan (CN)

(73) Assignee: WuHan TianMa Micro-electronics CO., LTD, Wuhan (CN)

( * ) Notice: Subject to any disclaimer, the term of this patent is extended or adjusted under 35 U.S.C. 154(b) by 22 days.

(21) Appl. No.: 16/730,547

(22) Filed: Dec. 30, 2019

(65) Prior Publication Data
US 2021/0020864 A1 Jan. 21, 2021

(30) Foreign Application Priority Data

Jul. 19, 2019 (CN) .......................... 201910653758.8

(51) Int. Cl.
| | |
|---|---|
| *H01L 51/52* | (2006.01) |
| *H01L 27/32* | (2006.01) |
| *H01L 51/00* | (2006.01) |
| *H01L 51/56* | (2006.01) |

(52) U.S. Cl.
CPC ...... *H01L 51/5253* (2013.01); *H01L 27/3234* (2013.01); *H01L 27/3244* (2013.01); *H01L 51/0017* (2013.01); *H01L 51/0097* (2013.01); *H01L 51/56* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

2017/0373129 A1* 12/2017 Kim .................... H01L 27/3265

FOREIGN PATENT DOCUMENTS

| CN | 107546245 A | 1/2018 |
|---|---|---|
| CN | 107799659 A | 3/2018 |
| CN | 109216408 A | 1/2019 |

OTHER PUBLICATIONS

First Office Action dated Jan. 11, 2021, received for Chinese Patent Application No. 201910653758.8, filed Jul. 19, 2019, 11 pages.

* cited by examiner

*Primary Examiner* — J. E. Schoenholtz
(74) *Attorney, Agent, or Firm* — Christensen O'Connor Johnson Kindness PLLC

(57) ABSTRACT

A display panel has a first non-display area between an opening area and a display area. The display area surrounds the first non-display area. The opening area penetrates the display panel. The display panel includes a substrate, a first functional layer, and a light-emitting functional layer. The first functional layer has a protruding portion at a warped position and has a first opening penetrating the first functional layer at the warped position. The first opening extends into the protruding portion to form a cavity having bottom and side surfaces. An included angle θ formed between the bottom surface and at least a part of the side surface satisfies 0<θ≤90°. A light-emitting functional layer located at a side of first functional layer away from substrate includes a common layer in first non-displaying and display areas and is split at protruding portion.

21 Claims, 12 Drawing Sheets

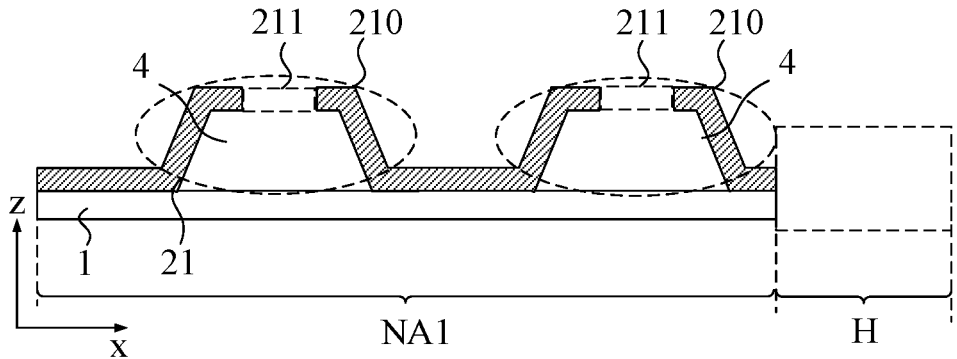

FIG. 12

| Providing a substrate, the substrate having an opening area, a non-display area and a display area, the opening area penetrating a display panel, the non-display area including a first non-display area and a second non-display area, the first non-display area being located between the opening area and the display area and surrounding the opening area, the display area surrounding the first non-display area, and the second non-display area surrounding the display area | ~S1 |
|---|---|

↓

| Forming a first functional film layer at a side of the substrate, the first functional film layer being warped at a warped position in the first non-display area and having a protruding portion at the warped position, the protruding portion protruding in a direction facing away from the substrate, the protruding portion having a first opening penetrating the first functional film layer, the first opening extending to an interior of the protruding portion to form a cavity, the cavity having a bottom surface and a side surface that are connected with each other, and an included angle θ formed between the bottom surface and at least a part of the side surface satisfies $0 < \theta \leq 90°$ | ~S2 |
|---|---|

↓

| Forming a light-emitting functional film layer at a side of the first functional film layer facing away from the substrate, the light-emitting functional film layer including a common layer in the first non-display area and the display area, and the common layer being split at the protruding portion | ~S3 |
|---|---|

FIG. 13

DISPLAY PANEL AND MANUFACTURING METHOD THEREOF, DISPLAY DEVICE

CROSS-REFERENCE TO RELATED APPLICATIONS

The present application claims priority to Chinese Patent Application No. 201910653758.8, filed on Jul. 19, 2019, the content of which is incorporated herein by reference in its entirety.

TECHNICAL FIELD

The present disclosure relates to the field of display technologies, and particularly, to a display panel, a manufacturing method of the display panel, and a display device.

BACKGROUND

Organic Light-Emitting Diode (OLED) display panel technology is widely used in the field of display technology because of its advantages of active illumination, high contrast, no limitation of viewing angle, and being suitable for flexible display. In order to increase the screen-to-body ratio of the flexible OLED display panel and enrich its functions, a display area is usually provided with a hollowed area for disposing a photosensitive element such as a camera or the like.

However, water and oxygen in the external environment may easily enter the display area through the hollowed area, resulting in a risk of encapsulation failure of the display panel.

SUMMARY

The present disclosure provides a display panel, a manufacturing method of the display panel, and a display device.

In one aspect, a display panel is provided. The display panel has an opening area, a display area and a non-display area, the opening area penetrating the display panel. The non-display area includes a first non-display area. The first non-display area is located between the opening area and the display area and surrounds the opening area. The display area surrounds the first non-display area. The display panel includes a substrate, a first functional layer and a light-emitting functional layer. The first functional layer located at a side of the substrate. The first functional layer is warped at a warped position in the first non-display area and is provided with at least one protruding portion at the warped position. Each of the at least one protruding portion protrudes in a direction facing away from the substrate, and the first functional layer is provided with at least one first opening at the warped position. Each of the at least one first opening penetrates the first functional layer and extends into one of the at least one protruding portion to form a cavity. The cavity includes a bottom surface and at least one side surface that are connected with each other, and an included angle θ formed between the bottom surface and at least a part of one of the at least one side surface satisfies 0<θ≤90°. The light-emitting functional layer is located at a side of the first functional layer facing away from the substrate. The light-emitting functional layer includes a common layer. The common layer is located in the first non-display area and the display area and is split at the at least one protruding portion.

In another aspect, a manufacturing method of a display device is provided. The manufacturing method includes the following steps: providing a substrate having an opening area, a display area and a non-display area, wherein the opening area penetrates the display panel, the non-display area comprises a first non-display area, the first non-display area is located between the opening area and the display area and surrounds the opening area, and the display area surrounds the first non-display area; forming a first functional layer at a side of the substrate; and forming a light-emitting functional layer at a side of the first functional layer facing away from the substrate. The step of forming the first functional layer at the side of the substrate comprises: forming a protruding portion in the first non-display area by warping of the first functional layer at a warped position, wherein the protruding portion protrudes in a direction facing away from the substrate; and forming a cavity by extending of a first opening into the protruding portion, wherein the first opening is provided in the first functional at the side of the substrate and is located at the protruding portion, the cavity comprises a bottom surface and at least one side surface that are connected with each other, and an included angle θ formed between the bottom surface and at least a part of one of the at least one side surface satisfies 0<θ≤90°. The light-emitting functional layer comprises a common layer, wherein the common layer is located in the first non-display area and the display area and is split at the protruding portion.

In yet another aspect, a display device is provided. The display device includes the display panel as mentioned above.

BRIEF DESCRIPTION OF DRAWINGS

In order to illustrate technical solutions of embodiments of the present disclosure, the accompanying drawings used in the embodiments are introduced hereinafter. These drawings illustrate some embodiments of the present disclosure.

FIG. 12 is a sectional view of yet another cavity according to an embodiment of the present disclosure;

FIG. 13 is a flowchart of a manufacturing method of a display panel according to an embodiment of the present disclosure;

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B may indicate only A, both A and B, or only B. In addition, the symbol "/" in the context generally indicates that the relation between the objects in front and at the back of "/" is an "or" relationship.

It should be understood that although the terms 'first', 'second', 'third', or the like can be used in the present disclosure to describe functional layers, the functional layers should not be limited to these terms. These terms are used to distinguish the functional layers from each other. For example, without departing from the scope of the embodiments of the present disclosure, a first functional layer can also be referred to as a second functional layer. Similarly, the second functional layer can also be referred to as the first functional layer.

Figure 1:
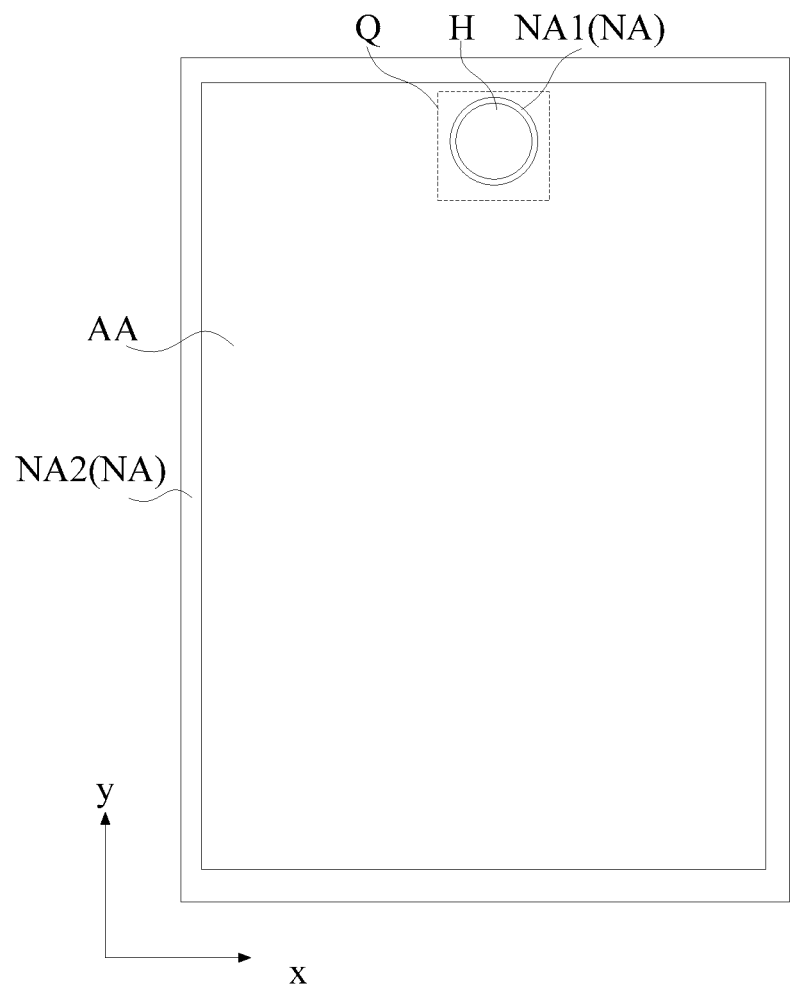
FIG. 1 is a schematic diagram of a display panel according to an embodiment of the present disclosure.

Embodiments of the present disclosure provide a display panel. FIG. 1 is a schematic diagram of a display panel according to some embodiments of the present disclosure. Referring to FIG. 1, the display panel has an opening area H, a non-display area NA, and a display area AA. The non-display area NA includes a first non-display area NA1 and a second non-display area NA2. The first non-display area NA1 is located between the opening area H and the display area AA, and surrounds the opening area H. The display area AA surrounds the first non-display area NA1, and the second non-display area NA2 surrounds the display area AA.

Figure 2:
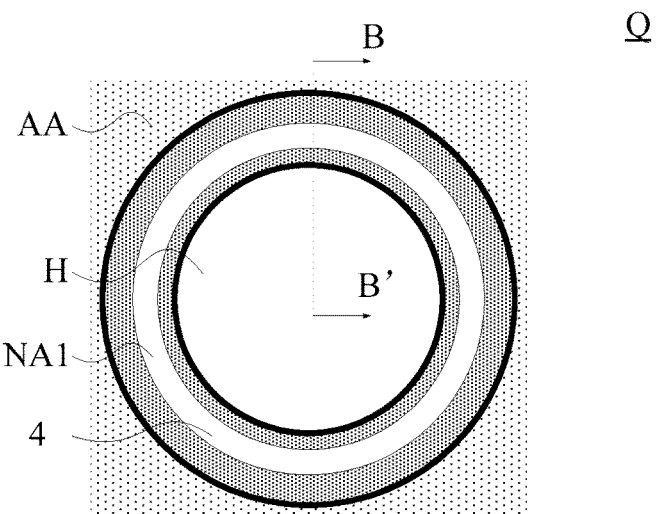
FIG. 2 is an enlarged view of an area Q in FIG. 1.
Figure 3:
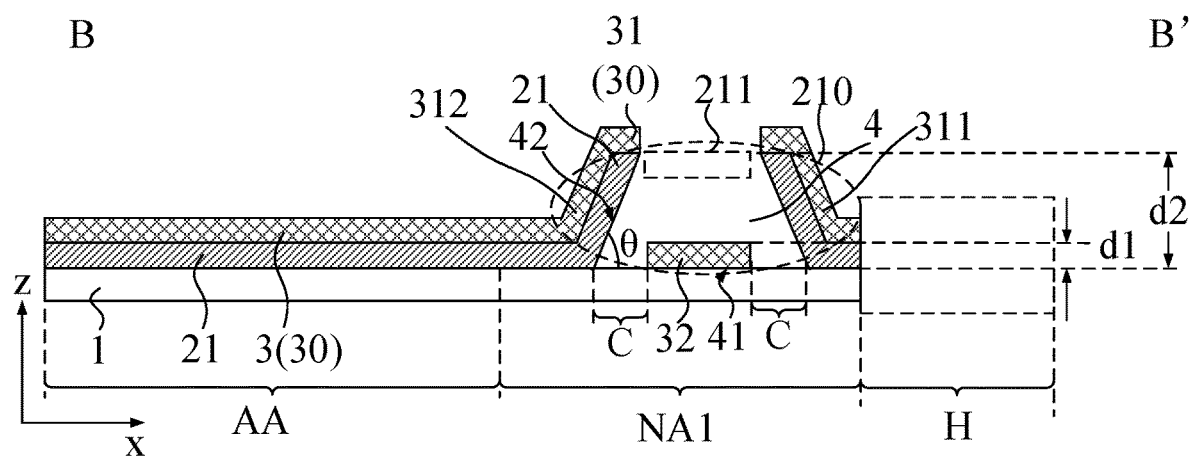
FIG. 3 is a sectional view of the display panel taken along line BB' in FIG. 2.

FIG. 2 is an enlarged view of an area Q in FIG. 1. FIG. 3 is a sectional view of the display panel taken along line BB' in FIG. 2. As shown in FIG. 2 and FIG. 3, the display panel includes a substrate 1, a first functional layer 21, and a light-emitting functional layer 3. The first functional layer 21 and the light-emitting functional layer 3 are stacked at a side of the substrate 1, that is, the first functional layer 21 is located at the side of the substrate 1, and the light-emitting functional layer 3 is located at a side of the first functional layer 21 facing away from the substrate 1.

In an embodiment, a device such as a camera or a photoelectric sensor can be disposed in the opening area H for enriching functions of the display panel. As shown in FIG. 3, the opening area H penetrates the display panel. In an embodiment, that the opening area H penetrates the display panel indicates that the first functional layer 21 and the light-emitting functional layer 3 are not disposed in the opening area H. In an embodiment, the substrate 1 is not arranged in the opening area H, that is, as shown in FIG. 3, a part, located in the opening area H, of the substrate 1 is cut off in such a manner that a through hole is formed in the opening area H. In another embodiment, the substrate 1 is arranged in the opening area H, that is, a blind hole is formed in the opening area H, which is not limited in the present disclosure.

As shown in FIG. 3, the first functional layer 21 is warped at a warped position in the first non-display area NA1 and is provided with a protruding portion 210 at the warped position. The protruding portion 210 protrudes in a direction facing away from the substrate 1, that is, the protruding direction of the protruding portion 210 is a direction z in FIG. 3. In an embodiment, as shown in FIG. 3, the first functional layer 21 at the protruding portion 210 that is formed by warping of the first functional layer 21 has a same thickness as other positions of the first functional layer 21. At the warped position, the first functional layer 21 protrudes in the direction facing away from the substrate 1 (that is, the direction z in FIG. 3), and is separated from the substrate 1 that is below the first functional layer 21. That is, the term 'warped' indicates that layers are separated from each other.

Figure 4:
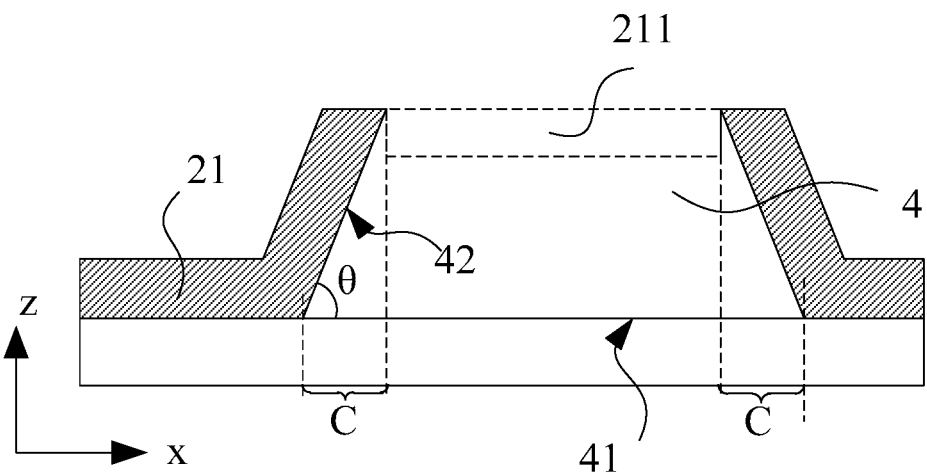
FIG. 4 is an enlarged view of a cavity in FIG. 3.

As shown in FIG. 3, the first functional layer 21 has a first opening 211 at the warped position, and the first opening 211 penetrates the first functional layer 21. The first opening 211 extends into the protruding portion 210 to form a cavity 4. An interior of the protruding portion 210 refers to a space between the first functional layer 21 forming the protruding portion 210 and the substrate 1, which means that the first opening 211 extends in a direction from the first opening 211 to the substrate 1, that is, the first opening 211 extends in an opposite direction of the direction z in FIG. 3. FIG. 4 is an enlarged view of the cavity in FIG. 3. As shown in FIG. 4, the cavity 4 includes a bottom surface 41 and a side surface 42 that are connected with each other, and an included angle θ formed between at least a part of the side surface 42 and the bottom surface 41 satisfies $0<θ≤90°$.

Referring to FIG. 3, the light-emitting functional layer 3 includes a common layer 30. The common layer 30 is located in the first non-display area NA1 and the display area AA, and is split at the protruding portion 210.

The light-emitting functional layer 3 includes a first electrode, a hole transport layer, a hole injection layer, a light-emitting layer, an electron transport layer, an electron injection layer, and a second electrode, which are stacked. When the display panel is displaying an image, holes generated in the first electrode and electrons generated in the second electrode are injected into the light-emitting layer, and then are recombined to generate exciton. Exciton transition of the exciton from an excited state to a ground state generates radiation, such that the light-emitting layer emits light with a corresponding color. In the present embodiment, with the hole transport layer, the hole injection layer, the electron injection layer, and the electron transport layer, a recombination efficiency of current carrier is improved, and injection and transport of the current carrier are balanced.

The common layer 30 includes one or more of: the hole transport layer, the hole injection layer, the light-emitting layer, the electron injection layer, or the electron transport layer. Since the hole transport layer, the hole injection layer, the light-emitting layer, the electron injection layer, and the electron transport layer each are typically organic layers made from organic material and have a poor ability to block water and oxygen, water and oxygen in the external environment can easily enter the display panel by penetrating the organic layers, in which the organic layers are an invade path for the water and oxygen. In the embodiments of the present disclosure, the cavity 4 is provided in a portion, in the first non-display area NA1, of the first functional layer 21, and the included angle θ formed between at least a part of the side surface 42 and the bottom surface 41 of the cavity 4 satisfies 0<θ≤90°. As shown in FIG. 3 and FIG. 4, with the included angle θ, an area C of the bottom surface 41 of the cavity of 4 is overlapped with an orthogonal projection of the side surface 42. The area C is a part of the bottom surface 41 of the cavity of 4, and is located within an orthogonal projection of the side surface 42 of the cavity 4 on the bottom surface 41. Therefore, if the common layer 30 is formed at the side of the first functional layer 21 facing away from the substrate 1 through evaporation and the like, the area C of the bottom surface 41 can be shielded by the side surface 42 of the cavity 4, such that the common layer 30 is not formed in the area C. The common layer 30 is formed on the bottom surface 41 of the cavity 4 except for the area C and is formed at the protruding portion 210 of the first functional layer 21 except for the first opening 211. Therefore, with the included angle θ, the common layer 30 is split in the area C. In this way, even if the water and oxygen can enter the common layer 30 from the opening area H, the water and oxygen cannot invade into the display area AA via the first non-display area NA1, because the common layer 30 is split at the cavity 4 in in the first non-display area NA1 and the invade path is blocked. In this way, light-emitting elements and other elements in the display area AA are protected from water and oxygen corrosion, and the encapsulation reliability of the display panel is improved.

In an embodiment of the present disclosure, the cavity 4 can be formed as follows. The first functional layer 21 is warped in the first non-display area NA1 to form the protruding portion 210, the first opening 211 penetrating the first functional layer 21 is formed at the warped position of the first functional layer 21. Then the first opening 211 extends into the protruding portion 210 to form the cavity 4. It should be understood that the first opening is a hollow part of the first functional layer, that the first opening 211 extends into the protruding portion 210 to form the cavity 4 indicates that the hollow part extends, via the first opening, into the protruding portion 210, and an interior of the protruding portion is a hollow structure to form the cavity. That is, the first opening of the first functional layer and the interior of the protruding portion 210 are hollow, i.e., the first opening and the hollow structure (cavity) in the interior of the protruding portion 210 communicate with each other. In the display panel provided by embodiments of the present disclosure, a depth of the cavity 4 can be adjusted by adjusting a warped degree of the first functional layer 21, that is, the depth of the cavity 4 can be adjusted by adjusting a protrusion degree of the protruding portion 210 formed by the first functional layer 21. In other words, the depth of the cavity 4 is not limited by the thickness of the first functional layer 21. In this way, even in a case where a designed thickness of the first functional layer 21 is small due to the process requirement or the thickness requirement of the display panel, the cavity 4 of the display panel provided by embodiments of the present disclosure can have a desired large depth, thereby ensuring that the common layer 30 formed subsequently is split at the cavity and ensuring the encapsulation reliability of the display panel.

Moreover, with the display panel provided by the embodiments of the present disclosure, by forming the cavity 4 in the first non-display area NA1, a path through which the water and oxygen in the external environment invade into the display area AA via the first non-display area NA1 and the opening area is broke without changing a process for forming the light-emitting functional layer 3 including the common layer 30 and without an additional encapsulation layer in the first non-display area NA1, a process of manufacturing the display panel is simple, and the manufacture efficiency is improved.

As shown in FIG. 2 and FIG. 3, in representative embodiments of the present disclosure, the cavity 4 is disposed in the first non-display area NA1 between the display area AA and the opening area H, and the cavity 4 can cause the common layer 30 to be split in the first non-display area NA1, thereby preventing the water and oxygen in the external environment entering the common layer 30 from invading the display area AA via the first non-display area NA1.

As shown in FIG. 2, the display area AA surrounds the opening area H, the cavity 4 is of an annular structure, which causes the cavity 4 surrounds the opening area H, such that the common layer in the opening area H is completely split from the common layer in the display area AA by the cavity 4 surrounding the opening area H. Therefore, external water and oxygen entering the opening area H is blocked in every direction by the cavity 4 and cannot enter the display area AA, thereby ensuring the encapsulation reliability of the display panel.

As shown in FIG. 3, in the direction z that is perpendicular to the substrate 1, a thickness d1 of the common layer 30 is smaller than a depth d2 of the cavity 4, thereby ensuring that the common layer 30 can be split at the cavity 4.

As shown in FIG. 3, the common layer 30 includes a first part 31 and a second part 32 separated from the first part 31. The first part 31 covers a surface of the first functional layer 21 facing away from the substrate 1. The second part 32 is located in the cavity 4. In a manufacturing process, the first part 31 and the second part 32 can be formed by a same process. With the cavity 4, the common layer 30 can be split at the position where the cavity 4 is located, to form the second part 32 in the cavity and the first part 31 outside the cavity. The first part 31 and second part 32 that are separated from each other can ensure that the water and oxygen entering the first non-display area via the opening area H cannot be transported between the first part 31 and the second part 32, and thus the water and oxygen in the external environment cannot invade the display area AA.

In some embodiments, the common layer 30 includes at least two split positions. As shown in FIG. 3, the first part 31 can include a first segment 311 and a second segment 312 that are located on two sides of the second part 32 respectively. The first segment 311 is located at a side of the second part 32 close to the opening area H. The second segment 312 is located at a side of the second part 32 close to the display area AA. In embodiments of the present disclosure, the first segment 311 is split from the second part 32, such that the water and oxygen in the external environment cannot invade from the opening area H into the second part 32 via the first segment 311. Moreover, in the embodiments of the present disclosure, with the second part 32 being split from the second segment 312, the invade path of the water and oxygen from the second part 32 to the display area AA is broke, thereby improving the encapsulation reliability.

As shown in FIG. 3, in an embodiment of the present disclosure, both a thickness of the first part 31 and a thickness of the second part 32 are d1, and both a thickness d1 of the first part 31 and a thickness d1 of the second part 32 are smaller than the depth d2 of the cavity 4, thereby ensuring that the first part 31 and the second part 32 are split at the position where the cavity 4 is located. In an embodiment, as shown in FIG. 3, a vertical distance d1 between the substrate 1 and a surface of the second part 32 facing away from the substrate 1 is smaller than a vertical distance d2 between the substrate 1 and a surface of the first part 31 close to the substrate 1, that is, the surface of the second part 32 facing away from the substrate 1 and the surface of the first part 31 close to the substrate 1 are not in contact with each other and are spaced apart by a distance, such that the first part 31 and the second part 32 are not connected to each other, thereby ensuring that the first part 31 and the second part 32 are completely separated and the invade path of water and oxide is completely cut off.

Figure 5:
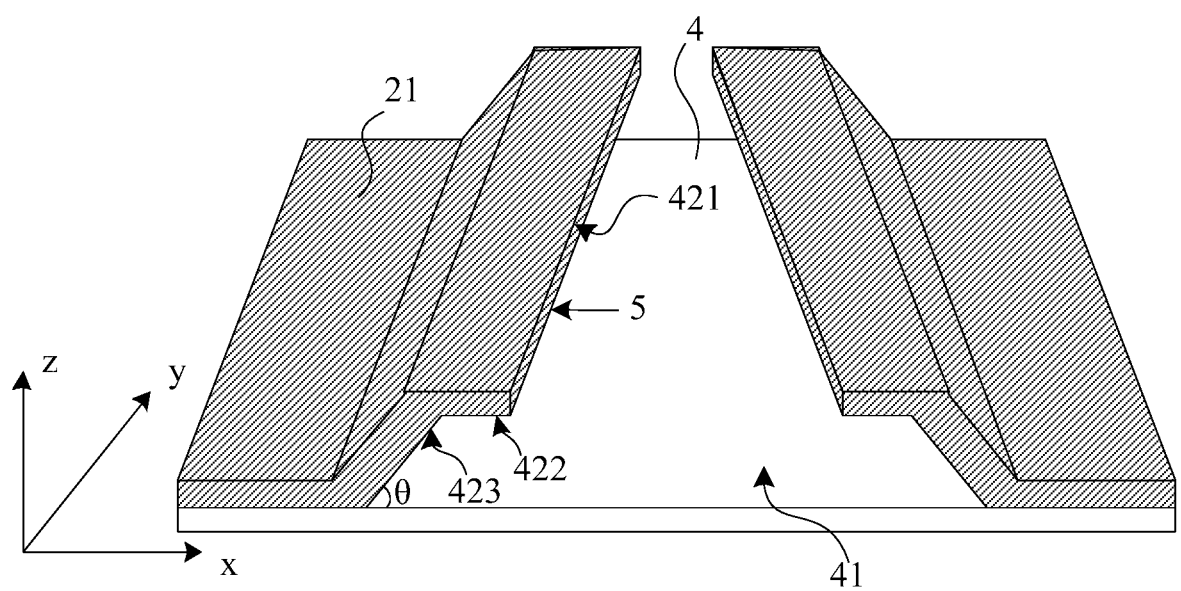
FIG. 5 is a perspective view of a cavity according to an embodiment of the present disclosure.
Figure 6:
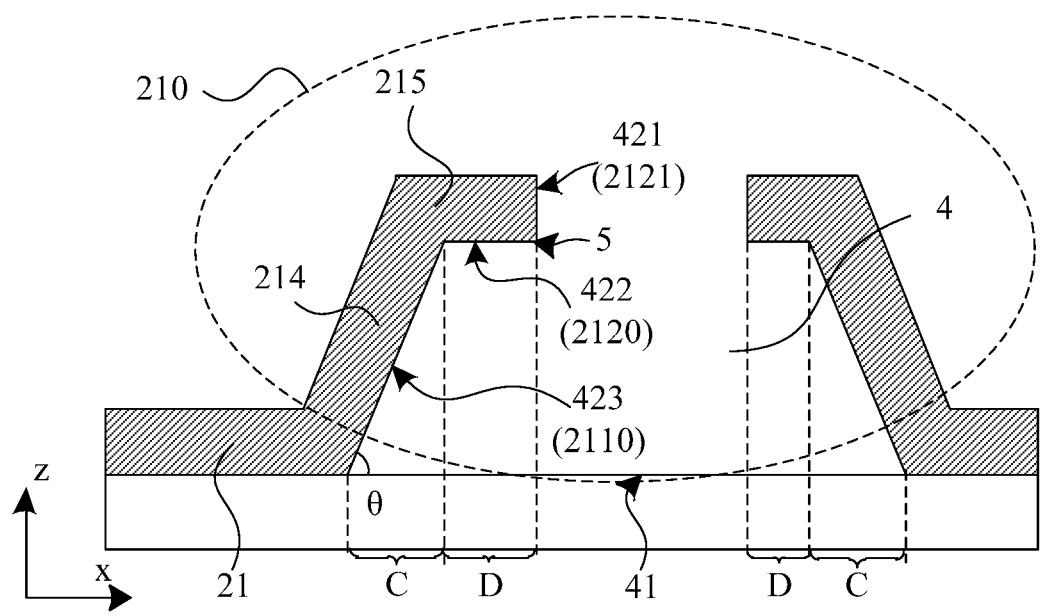
FIG. 6 is a sectional view of the cavity in FIG. 5.

FIG. 5 is a perspective view of a cavity according to an embodiment of the present disclosure. FIG. 6 is a sectional view of the cavity in FIG. 5 As shown in FIG. 5 and FIG. 6, the side surface of the cavity 4 includes a first side surface 421, a second surface 422 and a third side surface 423, which are sequentially connected. The first side surface 421 and the second side surface 422 intersect at a first intersecting line 5. The first side surface 421 extends, in the direction z which is a direction facing away from the substrate 1, from the first intersecting line 5 to the surface of the first functional layer 21 facing away from the substrate 1. The second side surface 422 is parallel with the bottom surface 41 of the cavity 4. The third side surface 423 is connected to the bottom surface 41 of the cavity 4. An included angle θ formed between the third side surface 423 and the bottom surface 41 of the cavity 4 satisfies 0<θ≤90°.

In an embodiment of the present disclosure, with the cavity 4 being provided with a second side surface 422, an orthogonal projection (the area D shown in FIG. 6) of the second side surface 422 on the plane of the substrate is overlapped with the bottom surface of the cavity 4. Therefore, when forming the common layer by means of evaporation and the like, the common layer is not formed in the area D of the bottom surface 41 of the cavity 4. Compared with the cavity 4 shown in FIG. 4, the cavity 4 in this embodiment is provided with the second side surface 422, which can increase a size of an area of the bottom surface 41 of the cavity 4 where no common layer is formed, thereby improving a possibility that the common layer is split at the position where the cavity 4 is located and further ensuring the encapsulation reliability of the display panel.

As shown in FIG. 6, the protruding portion 210 of the first functional layer 21 includes a side part 214 and a top part 215, that are connected to each other. A surface 2100 of the side part 214 close to the substrate is the third side surface 423 of the cavity 4. A surface 2120 of the top part 215 close to the substrate is the second side surface 422 of the cavity 4. The top part 215 further includes a side surface 2121 close to the first opening 211. The side surface 2121 of the top part 215 intersects the surface 2120 of the top part 215 close to the substrate, and is the first surface 421 of the cavity 4.

Figure 7:
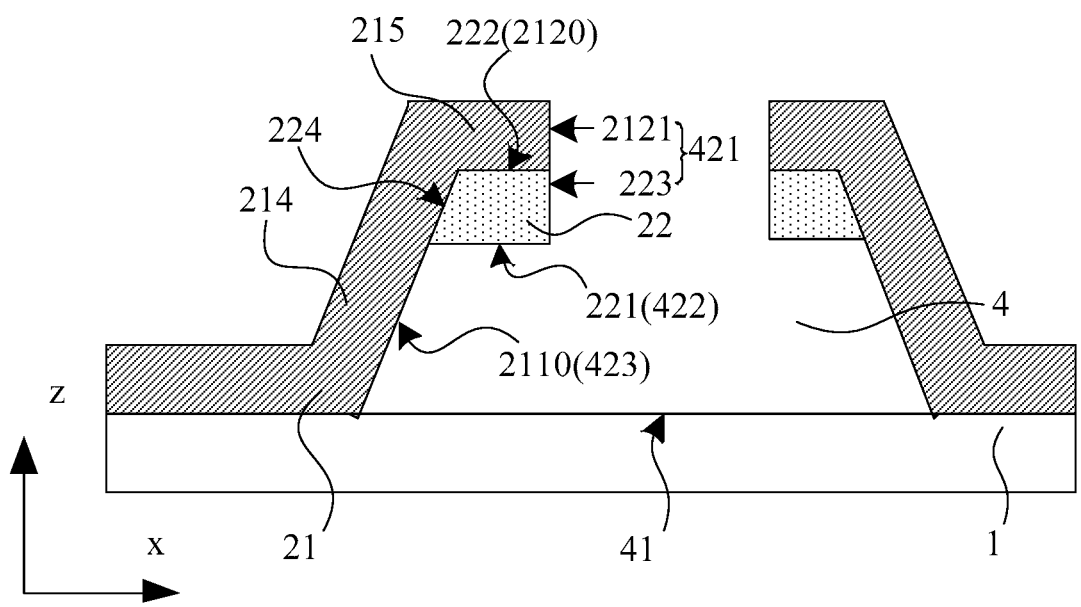
FIG. 7 is a sectional view of another cavity according to an embodiment of the present disclosure.

FIG. 7 is a sectional view of another cavity according to an embodiment of the present disclosure. As shown in FIG. 7, the first non-display area NA1 further includes a second functional layer 22 located in the cavity 4 and attached to the first functional layer 21.

In an embodiment, as shown in FIG. 7, in the direction z perpendicular to the substrate, the second functional layer 22 includes a first surface 221 and a second surface 222 that are opposite to each other. The first surface 221 is disposed on a side of the second functional layer 22 close to the substrate, and the second surface 222 is disposed on a side of the second functional layer 22 facing away from the substrate. In a direction parallel with the substrate, the second functional layer 22 further includes a third surface 223 and a fourth surface 224 that are opposite to each other. The third surface 223 intersects the first surface 221 and the second surface 222. The fourth surface 224 also intersects the first surface 221 and the second surface 222. The third surface 223 is located on a side of the second functional layer 22 close to the cavity 4. The fourth surface 224 is located on a side of the second functional layer 22 facing away from the cavity 4.

The second surface 222 of the second functional layer 22 is in contact with the surface 2120 of the top part 215 of the first functional layer 21. In this case, the cavity 4 is defined by the first functional layer 21 and the second functional layer 22 collectively. As shown in FIG. 7, the first side surface 421 of the cavity 4 includes the side surface 2121 of the top part 215 of the first functional layer 21 and the third surface 223 of the second functional layer 22. The first surface 221 of the second functional layer 22 is the second side surface 422 of the cavity 4. A surface 2110, close to the substrate, of the side part 214 of the first functional layer 21 has a part that is not in contact with the second functional layer 22, and this part of the surface 2110 is the third side surface 423 of the cavity 4. The protruding portion of the first functional layer 21 is supported by the second functional layer 22, thereby further ensuing a morphology of the protruding portion.

Figure 8:
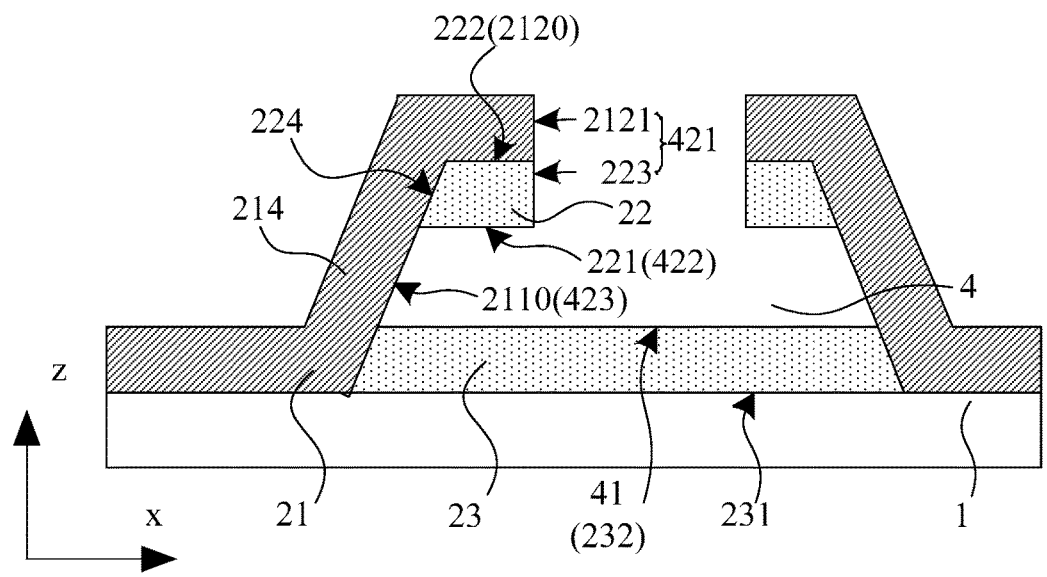
FIG. 8 is a sectional view of yet another cavity according to an embodiment of the present disclosure.

FIG. 8 is a sectional view of yet another cavity according to an embodiment of the present disclosure. As shown in FIG. 8, the first non-display area NA1 further includes a third functional layer 23 located between the cavity 4 and the substrate 1. In an embodiment shown in FIG. 8, the cavity 4 is formed between the second functional layer 22 and the third functional layer 23. In the direction z perpendicular to the substrate, the third functional layer 23 includes a first surface 231 and a second surface 232 that are opposite to each other. The first surface 231 of the third functional layer 23 is located on a side of the third functional layer 23 close to the substrate 1, and the second surface 232 of the third functional layer 23 is on one side of the third functional layer 23 facing away from the substrate 1. The second surface 232 of the third functional layer 23 is the bottom surface 41 of the cavity 4. A part, neither in contact with the second functional layer 22 nor the third functional layer 23, of the surface 2110, close to the substrate, of the side part 214 of the first functional layer 21 is the third side surface 423.

Figure 9:
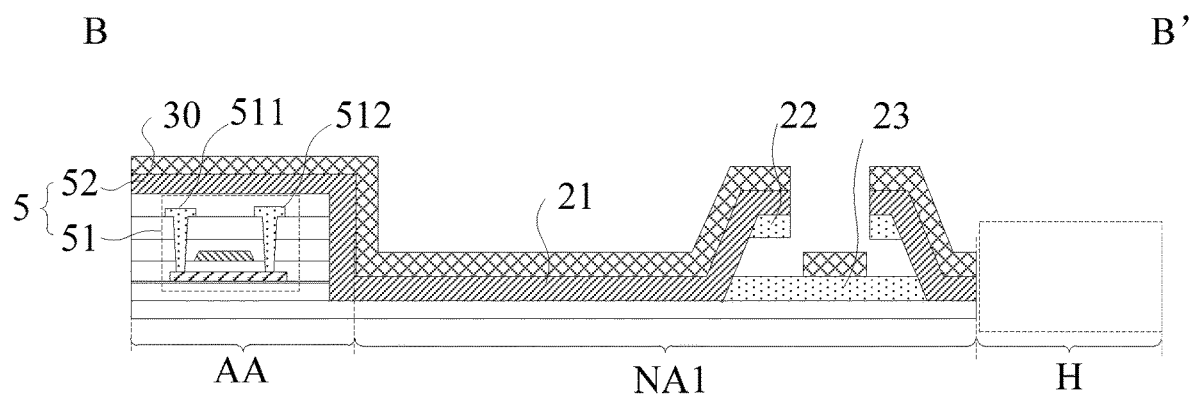
FIG. 9 is another sectional view of the display panel taken along line BB' in FIG. 2.

FIG. 9 is another sectional view of the display panel taken along line BB' in FIG. 2. As shown in FIG. 9, the display panel further includes a driving circuit layer 5 located in the display area AA. The driving circuit layer 5 is located between the substrate 1 and the common layer 30. The driving circuit layer 5 includes a thin transistor 51 and a passivation layer 52. The thin transistor 51 includes a source 511 and a drain 512 that are arranged in a same layer and are made of a same material. The passivation layer 52 is located at one side of the source 511 close to the common layer 30. The first functional layer 21 and the passivation layer 52 are formed in a same layer and are made of a same material. The second functional layer 22, the third functional layer 23 and the source 511 are formed by a same patterning process. In this way, in a formation of the driving circuit layer 5 in the display area, the first functional layer 21, the second functional layer 22 and the third functional layer 23 that are located in the first non-display area NA1 are formed simultaneously, which simplifies the manufacturing process of the display panel.

Figure 10:
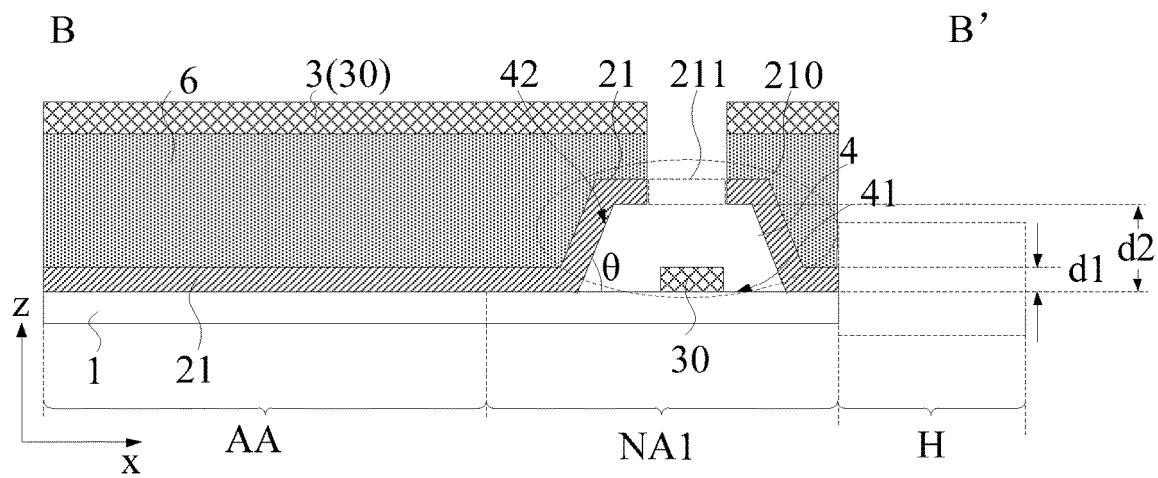
FIG. 10 is yet another sectional view of the display panel taken along line BB' in FIG. 2.

FIG. 10 is yet another sectional view of the display panel taken along line BB' in FIG. 2. As shown in FIG. 10, the display panel further includes an organic layer 6 located in the first non-display area NA1. The organic layer 6 is located between the first functional layer 21 and the common layer 30, and is in contact with the common layer 30. A surface of the organic layer 6 facing away from the substrate 1 is parallel with the plane of the substrate 1. On the basis of ensuring that the common layer 30 can be separated by the cavity 4 formed in the first non-display area NA1, the organic layer 6 can make the structure of the first functional layer 21 having the protruding portion 210 more stable and planarize layers in the display panel.

Figure 11:
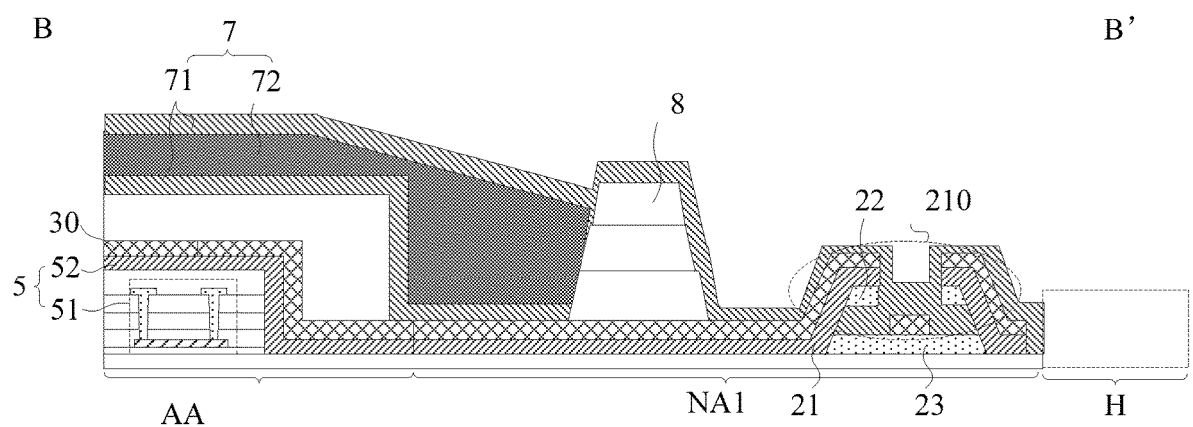
FIG. 11 is yet another sectional view of the display panel taken along line BB' in FIG. 2.

FIG. 11 is yet another sectional view of the display panel taken along line BB' in FIG. 2. As shown in FIG. 11, the display panel further includes an encapsulation layer 7 and a blocking part 8. The encapsulation layer 7 covers the common layer 30 and includes at least one inorganic encapsulation layer 71 and at least one organic encapsulation layer 72 that are stacked. The blocking part 8 is located in the first non-display area NA1. In this embodiment, as shown in FIG. 11, the blocking part 8 can be arranged at a side of the protruding portion 210 close to the display area AA. In another embodiment, the blocking part 8 is disposed at a side of the protruding portion 210 close to the opening area H. As shown in FIG. 11, an edge of the organic encapsulation layer 72 is in contact with a side surface of the blocking part 8 close to the display area AA. In the embodiment of the present disclosure, an arrangement of the blocking part 8 prevents the organic encapsulation layer 72 from extending across the blocking part 8, thereby preventing the organic encapsulation layer 72 from being exposed to the water and oxygen in the external environment and further ensuring the encapsulation reliability of the display panel. In one or more embodiments, the display panel includes multiple blocking parts 8.

In some embodiments, the display panel includes multiple first openings 211, which are arranged along a direction from the display area AA to the opening area H. FIG. 12 is a sectional view of yet another cavity according to an alternative embodiment of the present disclosure. As shown in FIG. 12, the display panel includes multiple protruding portions 210. Each protruding portions 210 is provided with one first opening 211. The multiple protruding portions 210 are arranged along the direction from the display area AA to the opening area H. In other embodiments, the display panel includes one protruding portion 210, and the one protruding portion 210 is provided with multiple first openings (not shown in the drawings), such that the common layer 30 is split at multiple positions in the first non-display area NA1, which further improves the encapsulation reliability of the display panel.

Figure 14:
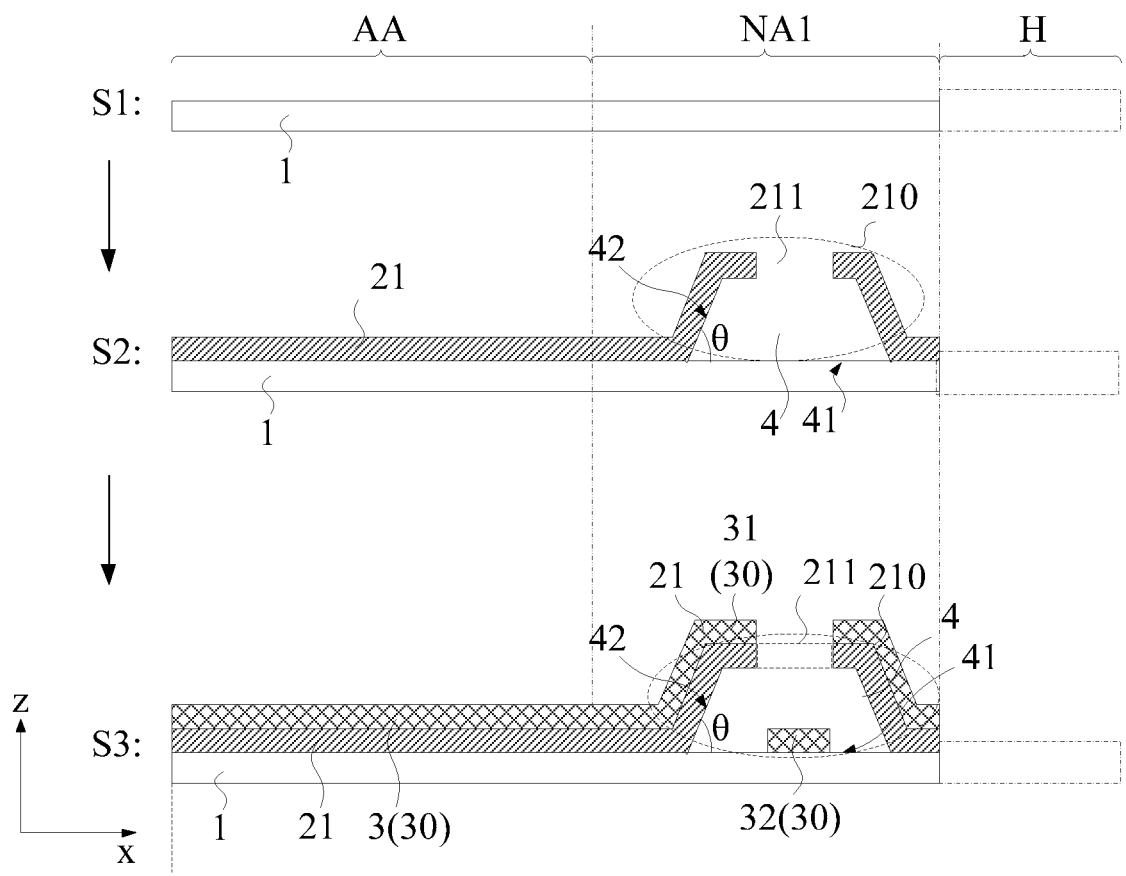
FIG. 14 is a diagram showing structures of the display panel in various steps of the manufacturing method according to an embodiment of the present disclosure.

Embodiments of the present disclosure further provide a manufacturing method of a display panel. FIG. 13 is a flowchart of a manufacturing method of a display panel according to an embodiment of the present disclosure. FIG. 14 is a diagram showing structures of the display panel in various steps of the manufacturing method according to an embodiment of the present disclosure. As shown in FIG. 1, FIG. 13, and FIG. 14, the manufacturing method includes the following steps.

In step S1, a substrate 1 is provided. The substrate has an opening area H, a non-display area NA, and a display area AA. The non-display area NA includes a first non-display area NA1 and a second non-display area NA2. The first non-display area NA1 is located between the opening area H and the display area AA, and surrounds the opening area H. The display area AA surrounds the first non-display area NA1. The second non-display area NA2 surrounds the display area AA. The opening area H penetrates the display panel.

In step S2, a first functional layer 21 is formed at a side of the substrate 1. The first functional layer 21 is warped at a warped position in the first non-display area NA1 and has a protruding portion 210 at the warped position. The protruding portion 210 protrudes towards the direction z facing away from the substrate 1. The first functional layer 21 at the protruding portion facing away from the substrate 1 has a first opening 211 that extends into the protruding portion 210 to form a cavity 4. The cavity 4 includes a bottom surface 41 and a side surface 42 that are connected with each other, and an included angle θ formed between the bottom surface 41 and at least a part of the side surface 42 satisfies 0<θ≤90°.

In step S3, a light-emitting functional layer 3 is formed at a side of the first functional layer 21 facing away from the substrate 1. The light-emitting functional layer 3 includes a common layer 30. The common layer 30 is located in the first non-display area NA1 and the display area AA, and is split at a position where the protruding portion 210 is located.

Figure 15:
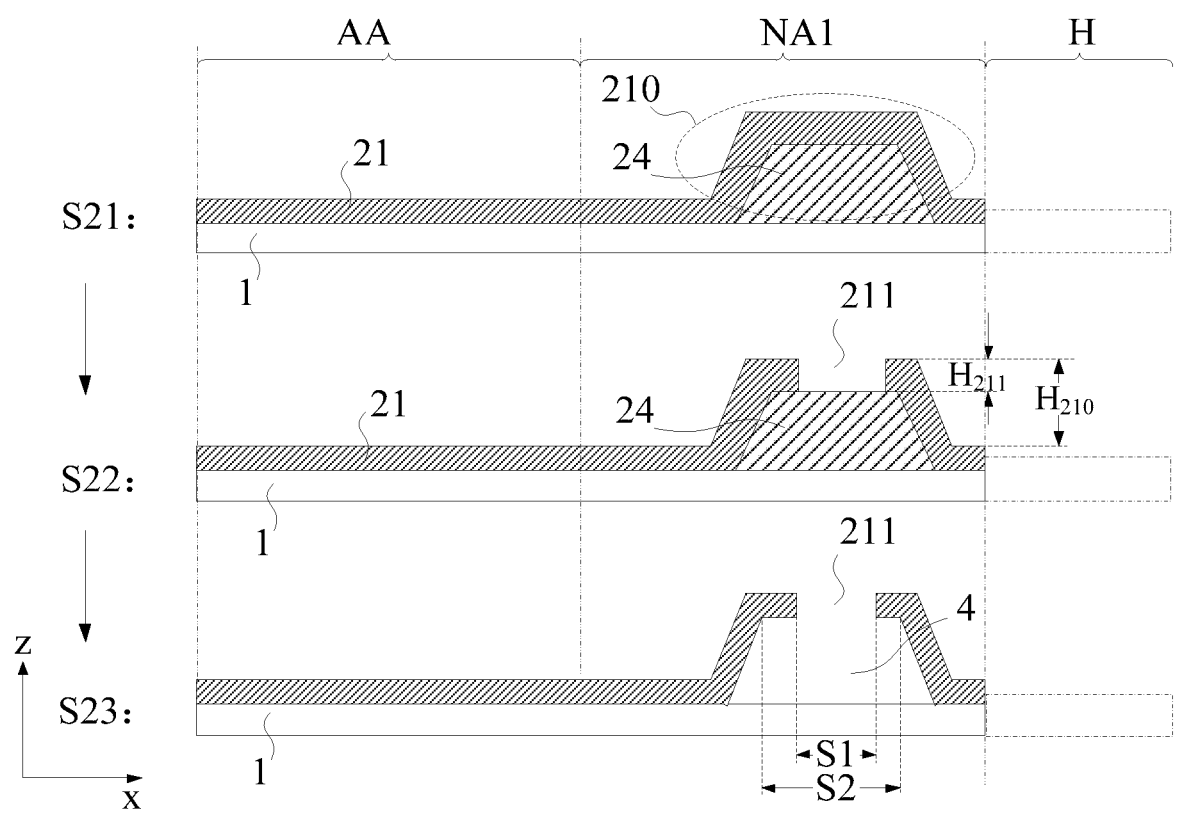
FIG. 15 is a diagram showing structures of the display panel in various steps of another manufacturing method according to an embodiment of the present disclosure.

FIG. 15 is a diagram showing structures of the display panel in various steps of another manufacturing method according to an embodiment of the present disclosure. As shown in FIG. 15, in the step S2, processes of forming, at the side of the substrate 1, the first functional layer 21 that is warped to form the protruding portion 210, and forming the cavity 4 at the protruding portion 210 includes steps described below.

In step S21, the first functional layer 21 is formed at the side of the substrate 1, in such a manner that a side of the first functional layer 21 is warped at the side of the substrate 1 to form the protruding portion 210.

In step S22, the first opening 211 is formed at a side of the protruding portion 210 facing away from the substrate 1. In the direction z perpendicular to the substrate 1, a depth $H_{211}$ of the first opening 211 is smaller than a height $H_{210}$ of the protruding portion 210.

In step S23, the cavity 4 communicating with the first opening 211 is formed in the protruding portion 210. The cavity 4 is located at a side of the first opening 211 close to the substrate 1. An area S1 of the first opening 211 on a side close to the substrate 1 is smaller than or equal to an area S2 of the cavity 4 on a side close to the common layer 30. The area S1, on the side close to the substrate 1, of the first opening 211 is an area of an orthogonal projection of the first opening 211 on the plane of the substrate 1. The area of the cavity 4 on the side close to the common layer 30 is an area of an orthogonal projection of the side, close to the common layer 30, of the cavity 4 on the plane of the substrate 1.

In embodiments of the present disclosure, the area S1, on the side close to the substrate 1, of the first opening 211 is smaller than or equal to the area S2, on the side close to the common layer 30, of the cavity 4, such that the cavity of the structure shown in FIG. 5 and FIG. 6, is formed. The side surface of the cavity 4 includes the first side surface 421, the second side surface 422 and the third side surface 423 that are connected sequentially. The first side surface 421 and the second side surface 422 intersect at a first intersecting line 5. The first side surface 421 extends, in the direction facing away from the substrate 1, from the first intersecting line 5 to the surface of the first functional layer 21 facing away from the substrate 1. A side wall of the first opening 211 is the first side surface 421 of the cavity 4. With the above method, the cavity 4 has a part exceeding the first opening 211, and this part can be used for forming the second side surface 422 of the cavity 4, such that an area of a part, where no common layer is formed, of the bottom surface 41 of the cavity 4 is increased, thereby increasing the possibility the common layer is split at the position where the cavity is located.

Figure 16:
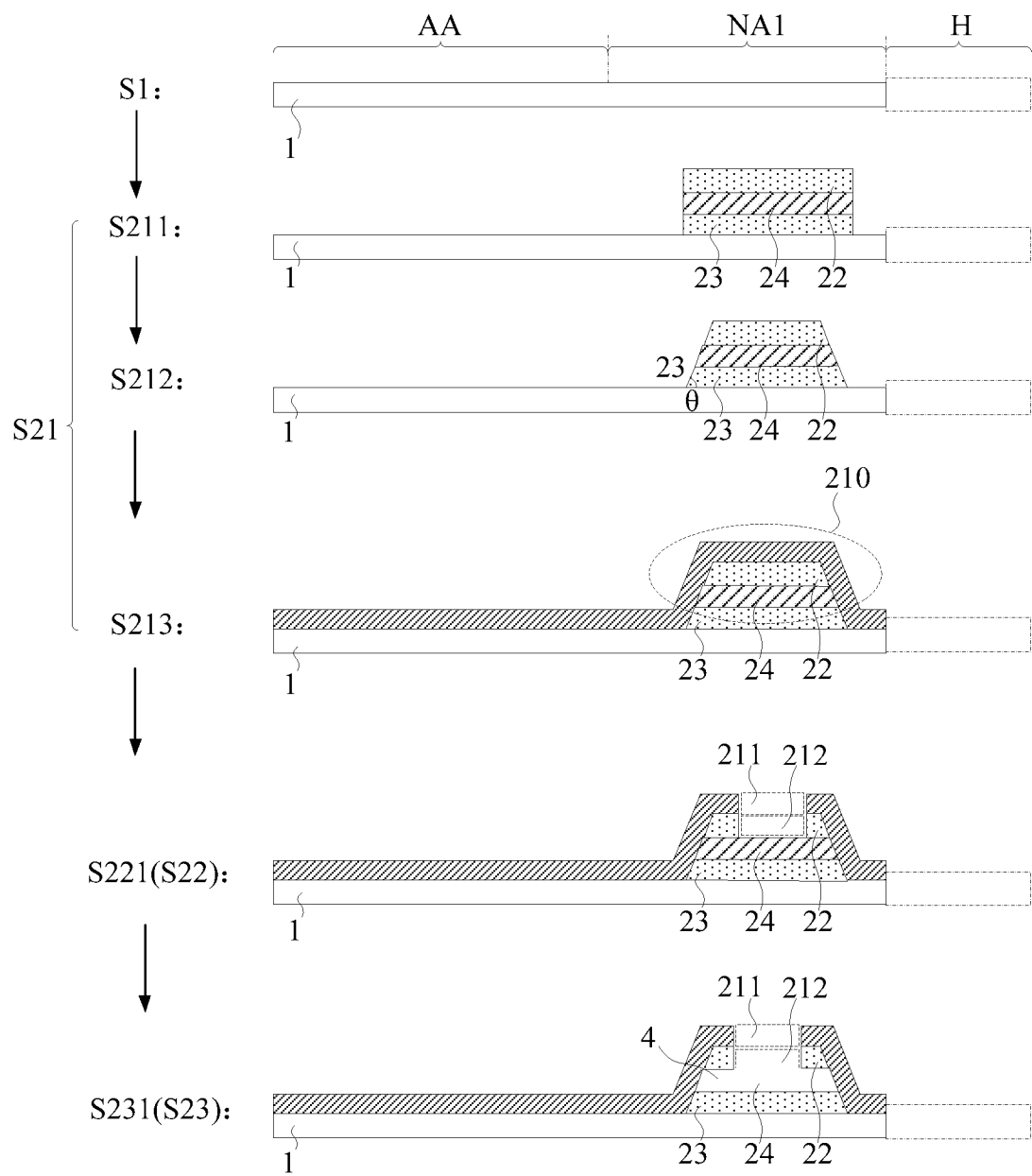
FIG. 16 is a diagram showing structures of the display panel in various steps of yet another manufacturing method according to an embodiment of the present disclosure.

As shown in FIG. 8, the display panel further includes a second functional layer 22 and a third functional layer 23 that are located in the first non-display area NA1. A formation process of the cavity of the structure shown in FIG. 8 is illustrated in FIG. 16. FIG. 16 is a diagram showing structures of the display panel in various steps of yet another manufacturing method according to an embodiment of the present disclosure. In an embodiment, as shown in FIG. 16, the step S21 in which the first functional layer 21 with the protruding portion 210 that is formed by warping of the first functional layer 21 at one side of the substrate 1 is formed at one side of the substrate 1 includes steps described below.

In step S211, the third functional layer 23, an intermediate layer 24, and the second functional layer 22 are successively formed on a same side of the substrate 1. The third functional layer 23, the intermediate layer 24, and the second functional layer 22 are stacked. The second functional layer 22 is located at one side of the intermediate layer facing away from the substrate 1, and the third functional layer 23 is located at one side of the intermediate layer close to the substrate 1. A thickness of the intermediate layer 24 is greater than a thickness of the common layer 30 that will be formed later.

In step S212, the third functional layer 23, the intermediate layer 24, and the second functional layer 22 are patterned in such a manner that each layer of the third functional layer 23, the intermediate layer 24, and the second functional layer 22 has a side surface that forms an included angle θ with a bottom surface of this layer, and the included angle θ satisfies 0<θ≤90°.

In step S213, the first functional layer 21 is formed at a side of the second functional layer 22 facing away from the substrate 1. The first functional layer 21 has a part covers the second functional layer 22, the intermediate layer 24 and the third functional layer 23, and this part is the protruding portion 210.

By the above steps S211 to S213, the first functional layer 21 is formed with the protruding portion 210 in the first non-display area NA1 due to arrangements of the third functional layer 23, the intermediate layer 24, and the second functional layer 22, and a morphology of the protruding portion 210 can be designed by adjusting morphology of the third functional layer 23, the intermediate layer 24, and the second functional layer 22, which is easy to implement.

Referring to FIG. 16, the step S22 in which the first opening 211 is formed at the protruding portion 210 from a side of the protruding portion 210 facing away from the substrate 1 includes the following step.

In step S221, the first functional layer 21 and the second functional layer 22 are patterned to form the first opening 211 penetrating the first functional layer 21 and a second opening 212 penetrating the second functional layer 22 respectively. An area of an orthogonal projection of the first opening 211 on the plane of the substrate 1 smaller than an area S4 of an orthogonal projection of the second functional layer 22 on the plane of the substrate, and an area of an orthogonal projection of the second opening 212 on the plane of the substrate 1 also smaller than the area S4 of the orthogonal projection of the second functional layer 22 on the plane of the substrate 1. That is, after the second opening 212 is formed, the second functional layer 22 is not completely removed, and a residual part of the second functional layer 22 exists and corresponds to the second side surface 422 of the cavity 4 that is formed subsequently.

The step S23 in which the cavity 4 communicating with the first opening 211 and the second opening 212 in the protruding portion 210 includes the following step.

In step S231, the intermediate layer 24 is removed through the first opening 211 and the second opening 212, and thus the cavity 4 communicating with first opening 211 and the second opening 212 is formed. The cavity 4 is disposed between the second functional layer 22 and the third functional layer 23, and is surrounded by the first functional layer 21.

In the embodiments of the present disclosure, firstly, the second functional layer 22, the intermediate layer 24, and the third functional layer 23 are patterned, such that the included angle θ formed by the side surface and the bottom surface of each of the third functional layer 23, the intermediate layer 24, and the second functional layer 22 satisfies 0<θ≤90°. In this way, when the first functional layer 21 is formed at the side of the second functional layer 22 facing away from the substrate 1, the first functional layer 21 is attached on the second functional layer 22, such that the second functional layer 22, the intermediate layer 24, and the third functional layer 23 are sandwiched between the substrate 1 and the first functional layer 21. Then, the first opening 211 is formed in the first functional layer 21 and the second functional layer 22. Then, the cavity 4 communicating with the first opening 211 and the second opening 212 is formed by removing the intermediate layer 24. By using the method provided by embodiments of the present disclosure, the cavity 4 is limited in the first functional layer 21. In this way, no matter the cavity 4 is formed by using etching solution or formed by other kinds of etching, an etching range is limited within the first functional layer 21, such that other layers which do not need etching are not affected.

Moreover, in the embodiments of the present disclosure, the cavity 4 is formed by removing the intermediate layer 24, so a desired depth of the cavity 4 can be achieved by adjusting the thickness of the intermediate layer 24, which is easy to implement.

As shown in FIG. 16, in the step S221 in which the first functional layer 21 and the second functional layer 22 are patterned to form the first opening 211 penetrating the first functional layer 21 and the second opening 212 penetrating the second functional layer 22, the first opening 211 and the second opening 212 can be formed by a same etching process to simplify the manufacturing process.

Figure 17:
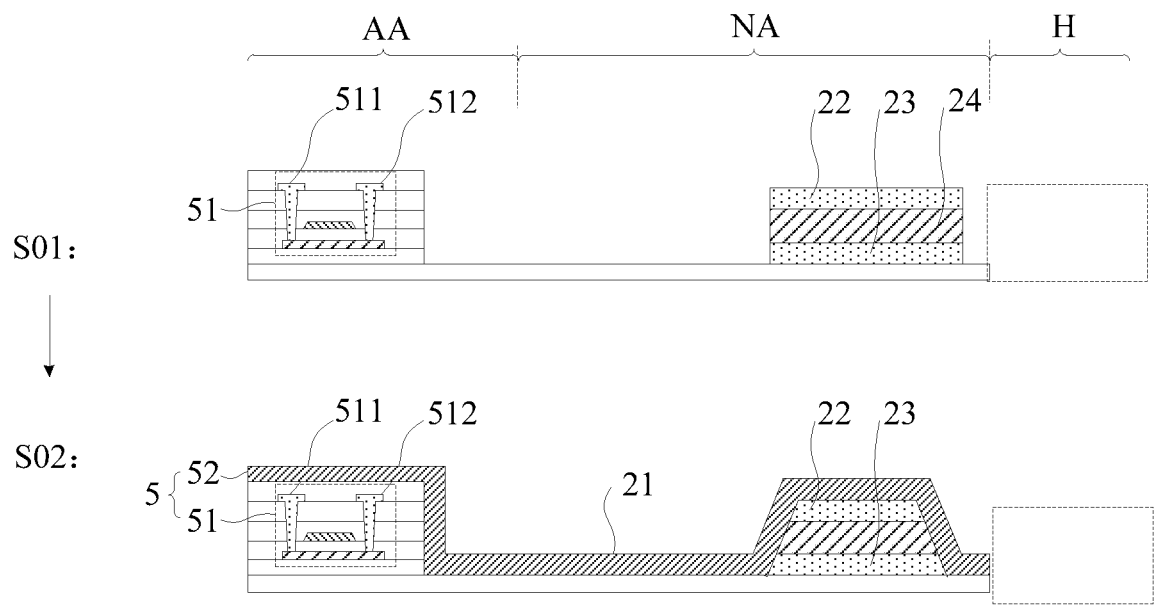
FIG. 17 is a diagram showing structures of the display panel in various steps of yet another manufacturing method according to an embodiment of the present disclosure.

As shown in FIG. 17, an orthogonal projection of the first opening 211 on the plane of the substrate 1 is overlapped with an orthogonal projection of the second opening 212 on the plane of where the substrate 1 is located is for facilitating subsequent formation of the cavity 4 through the first opening 211 and the second opening 212.

In one or more embodiments, a method of patterning the first functional layer 21 and the second functional layer 22 to form the first opening 211 penetrating the first functional layer 21 and the second opening 212 penetrating the second functional layer 22 is dry etching. In one or more embodiments, a method of removing the intermediate layer 24 through the first opening 211 and the second opening 212 is wet etching. In embodiments of the present disclosure, the first functional layer 21 and the second functional layer 22 are etched by the dry etching, thereby ensuring an etching precision and avoiding over etching which may cause damage to other layers which do not need to be etches. Since the intermediate layer 24 is surrounded by the first functional layer 21, the intermediate layer 24 is removed by means of wet etching in embodiments of the present disclosure. By selecting suitable etching solution, the intermediate layer 24 can be removed without affecting the first functional layer 21, the second functional layer 22 and the third functional layer 23 that are in contact with the intermediate layer 24. In addition, being surrounded by the first functional layer 21, the etching solution is prevented from flowing out of a space defined by the first functional layer 21, thereby improving an etching rate and protecting layers in a non-etching area of the display panel from being damaged.

In some embodiments, the display panel shown in FIG. 9 can be fabricated by using the method shown in FIG. 17. FIG. 17 is a diagram showing structures of the display panel in various steps of yet another manufacturing method according to an embodiment of the present disclosure. As shown in FIG. 17, the manufacturing method includes the following steps.

In step S01, a source 511 and a drain 512 of a driving circuit layer 5 are formed on a side of the substrate 1. Meanwhile, the second functional layer 22, the intermediate layer 24, and the third functional layer 23 can be formed. That is, the second functional layer 22, the intermediate layer 24, the third functional layer 23, and the source 511 can be formed by a same patterning process. In some embodiments, both the source 511 and the drain 512 can be made of Ti/Al/Ti alloy, so as to improve a conductivity of the source 511 and a conductivity of the drain 512. Accordingly, the third functional layer 23 can be made of Ti, the intermediate layer 24 can be made of Al, and the second functional layer 22 can be made of Ti. In addition, a layer made of Ti can protect a layer made of Al. In a process of etching the first functional layer 21 and the second functional layer 22 to form the first opening 211 and the second opening 212 respectively, the layer made of Ti can protect the layer made of Al from being etched, such that a morphology of the intermediate layer 24 made of Al is protected before Al is etched, and the morphology of the protruding portion is more stable and controllable.

In step S02, a passivation layer 52 is formed at a side of the source 511 facing away from the substrate 1. Meanwhile, the first functional layer 21 can be formed at a side of the second functional layer 22 facing away from the substrate 1. That is, the first functional layer 21 and the passivation layer 52 are formed in a same layer and are made of a same material, such that the encapsulation reliability is improved and the manufacturing process of the display panel is simplified.

Figure 18:
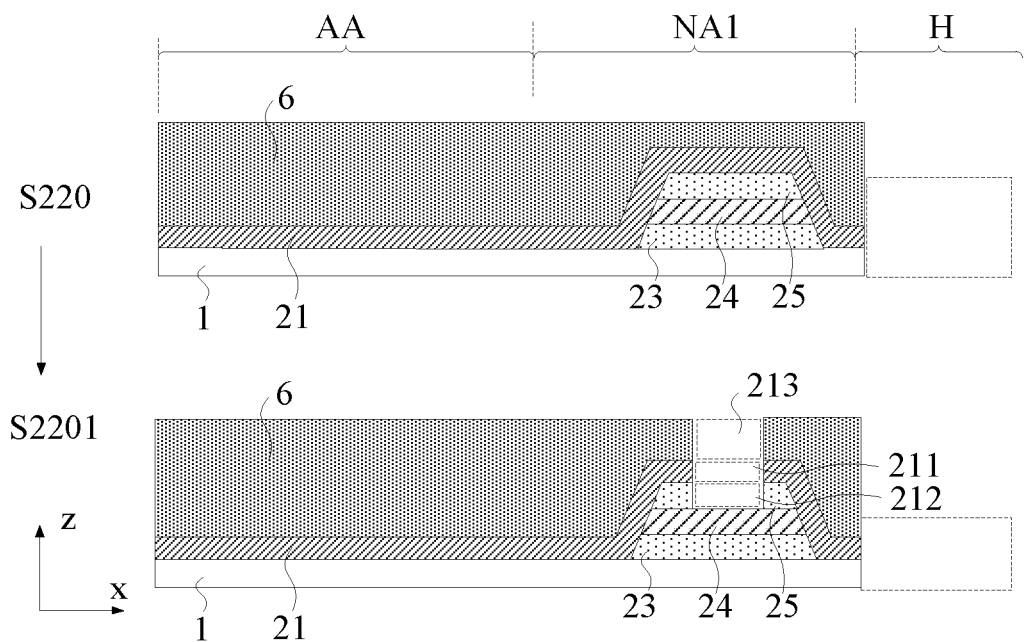
FIG. 18 is a diagram showing structures of the display panel in various steps of yet another manufacturing method according to an embodiment of the present disclosure.

FIG. 18 is a diagram showing structures of the display panel in various steps of yet another manufacturing method according to an embodiment of the present disclosure. In one or more embodiments, the display panel shown in FIG. 10 can be fabricated by using the method shown in FIG. 18. As shown in FIG. 18, after step S213 in which the first functional layer 21 is formed at a side of the patterned second functional layer 22 facing away from the substrate 1, and before step S221 in which the first functional layer 21 and the second functional layer 22 are patterned to form the first opening 211 penetrating the first functional layer 21 and the second opening 212 penetrating the second functional layer 22 respectively, the manufacturing method of the display panel including the organic layer 6 further includes the following steps.

In step S220, the organic layer 6 covering the first functional layer 21 is formed. A surface of the organic layer 6 facing away from the third functional layer 23 is parallel with the plane of the substrate 1. The organic layer 6 can make the first functional layer 21 having the protruding portion in a more stable structure, and can planarize layers of the display panel.

In step S2201, the organic layer 6 is patterned to form a third opening 213 penetrating the organic layer 6, and then the first opening 211 and the second opening 212 are formed, through the third opening 213, in the first functional layer 21 and the second functional layer 22 respectively, in such a manner that an orthogonal projection of the third opening 213 on the plane of the substrate 1 is overlapped with an orthogonal projection of the first opening 211 on the plane of the substrate 1. In some embodiments, as shown in FIG. 18, the third opening 213, the first opening 211 and the second opening 212 can be formed in a same step, which simplifies the manufacturing process.

Then, the cavity 4 can be formed by means of the step S231 shown in FIG. 16.

Figure 19:
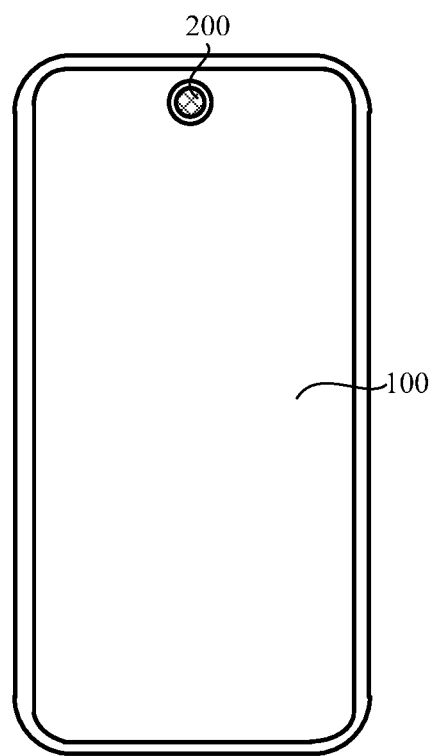
FIG. 19 is a schematic diagram of a display device according to an embodiment of the present disclosure.

The embodiments of the present disclosure further provide a display device. FIG. 19 is a schematic diagram of a display device according to an embodiment of the present disclosure. As shown in FIG. 19, the display device includes the above-mentioned display panel 100 and a photosensitive element 200 disposed in the opening area of the display panel 100. For example, the photosensitive element 200 include a camera and a sensor (such as an optical line sensor, a distance sensor, an iris identification sensor, and a fingerprint recognition sensor). The structure of the display panel 100 has been described in detail in the above embodiments, which is not repeated herein. Of course, the display device shown in FIG. 19 is just illustrative. The display device can be, for example, a cellphone, a tablet computer, a laptop, an electronic book reader, a television, or any other electronic device having display function.

While the exemplary embodiments of the present disclosure have been described above, the scope of the present disclosure is not limited thereto. Various modifications, equivalent alternatives or improvements can be made by those skilled in the art without departing from the scope of the present disclosure. These modifications, equivalent alternatives and improvements are to be encompassed in the scope of the present disclosure.

What is claimed is:

1. A display panel having an opening area, a display area and a non-display area, the opening area penetrating the display panel, the non-display area having a first non-display area, the first non-display area being located between the opening area and the display area and surrounding the opening area, and the display area surrounding the first non-display area, the display panel comprising:
    a substrate;
    a first functional layer located at a side of the substrate, wherein the first functional layer is warped at a warped position in the first non-display area and is provided with at least one protruding portion at the warped position, each of the at least one protruding portion protrudes in a direction facing away from the substrate, wherein the first functional layer is provided with at least one first opening at the warped position, one of the at least one first opening penetrates the first functional layer and extends into one of the at least one protruding portion to form a cavity having a bottom surface and at least one side surface that are connected with each other, wherein an included angle θ formed between the bottom surface and at least a part of one of the at least one side surface of the cavity satisfies 0<θ≤90°; and a light-emitting functional layer located at a side of the first functional layer facing away from the substrate, wherein the light-emitting functional layer comprises a common layer, wherein the common layer is located in the first non-display area and the display area and is split at the at least one protruding portion, wherein the at least one side surface of the cavity comprises a first side surface, a second side surface, and a third side surface that are sequentially connected with each other;

the first side surface and the second side surface intersect at a first intersecting line, the first side surface extending from the first intersecting line in the direction facing away from the substrate to a surface of the first functional layer facing away from the substrate;

the second side surface is parallel with the bottom surface of the cavity; and the third side surface and the bottom surface of the cavity are connected to each other, and the included angle θ is an included angle formed between the third side surface and the bottom surface of the cavity and satisfies 0<θ≤90°.

2. The display panel according to claim 1, wherein the cavity is located between the display area and the opening area, has a ring structure, and surrounds the opening area.

3. The display panel according to claim 1, wherein in a direction perpendicular to the substrate, the common layer has a thickness smaller than a depth of the cavity.

4. The display panel according to claim 3, wherein:
the common layer comprises a first part and a second part split from the first part, wherein the first part covers a surface of the first functional layer facing away from the substrate;
the second part is located in the cavity;
the first part and the second part are formed by a same process;
the first part has a same thickness as the second part;
the second part has a thickness smaller than the depth of the cavity; and
a vertical distance between a surface of the second part facing away from the substrate and the substrate is smaller than a vertical distance between a surface of the first part close to the substrate and the substrate.

5. The display panel according to claim 1, further comprising a second functional layer located in the first non-display area, wherein the second functional layer is located in the cavity and is attached to the first functional layer.

6. The display panel according to claim 5, further comprising an organic layer located in the first non-display area, wherein the organic layer is located between the first functional layer and the common layer and is in contact with the common layer, and a surface of the organic layer facing away from the substrate is parallel with a plane of the substrate.

7. A display panel having an opening area, a display area and a non-display area, the opening area penetrating the display panel, the non-display area having a first non-display area, the first non-display area being located between the opening area and the display area and surrounding the opening area, and the display area surrounding the first non-display area, the display panel comprising:
a substrate;

a first functional layer located at a side of the substrate, wherein the first functional layer is warped at a warped position in the first non-display area and is provided with at least one protruding portion at the warped position, each of the at least one protruding portion protrudes in a direction facing away from the substrate, wherein the first functional layer is provided with at least one first opening at the warped position, one of the at least one first opening penetrates the first functional layer and extends into one of the at least one protruding portion to form a cavity having a bottom surface and at least one side surface that are connected with each other, wherein an included angle θ formed between the bottom surface and at least a part of one of the at least one side surface of the cavity satisfies 0<θ≤90°;

a light-emitting functional layer located at a side of the first functional layer facing away from the substrate, wherein the light-emitting functional layer comprises a common layer, wherein the common layer is located in the first non-display area and the display area and is split at the at least one protruding portion; and a third functional layer located in the first non-display area, wherein the third functional layer is located between the cavity and the substrate and is in contact with the bottom surface of the cavity.

8. The display panel according to claim 7, further comprising a driving circuit layer located in the display area and disposed between the substrate and the common layer,
wherein the driving circuit layer comprises a thin transistor and a passivation layer, wherein the thin transistor comprises a source and a drain that are arranged in a same layer and are made of a same material, and the passivation layer is disposed at a side of the source close to the common layer; and
wherein the first functional layer and the passivation layer are formed in a same layer and are made of a same material, and the second functional layer, the third functional layer and the source are formed by a same patterning process.

9. The display panel according to claim 1, further comprising:
an encapsulation layer covering the common layer, wherein the encapsulation layer comprises at least one inorganic encapsulation layer and at least one organic encapsulation layer that are stacked; and
at least one blocking part located in the first non-display area, wherein the at least one blocking part is disposed at a side of one of the at least one protruding portion close to the display area, or is arranged at a side of the one of the at least one protruding portion close to the opening area,
wherein an edge of one of the at least one organic encapsulation layer is in contact with a side surface, close to the display area, of one of the at least one blocking part.

10. The display panel according to claim 1, wherein the at least one first opening comprises a plurality of first openings, and the plurality of first openings is arranged in a direction from the display area to the opening area.

11. A display device, comprising: the display panel according to claim 1.

12. A manufacturing method of a display panel, comprising:
providing a substrate having an opening area, a display area and a non-display area, wherein the opening area penetrates the display panel, the non-display area comprises a first non-display area, the first non-display area is located between the opening area and the display area and surrounds the opening area, and the display area surrounds the first non-display area;

forming a first functional layer at a side of the substrate by:
forming a protruding portion in the first non-display area by warping of the first functional layer at a warped position, wherein the protruding portion protrudes in a direction facing away from the substrate; and
forming a cavity by extending of a first opening into the protruding portion, wherein the first opening is provided in the first functional layer arranged at the side of the substrate and is located at the protruding portion, the cavity comprises a bottom surface and at least one side surface that are connected with each other, and an included angle θ formed between the bottom surface and at least a part of one of the at least one side surface satisfies 0<θ≤90°; and
forming a light-emitting functional layer at a side of the first functional layer facing away from the substrate, wherein the light-emitting functional layer comprises a common layer, wherein the common layer is located in the first non-display area and the display area and is split at the protruding portion,
wherein forming the protruding portion comprises forming the first opening in the first functional layer facing away from the substrate and at the protruding portion, wherein in a direction perpendicular to the substrate, the first opening has a depth smaller than a height of the protruding portion; and
wherein forming the cavity at the protruding portion comprises forming, in the protruding portion, the cavity that communicates with the first opening, wherein the cavity is located at a side of the first opening close to the substrate, and an area of a side of the first opening close to the substrate is smaller than or equal to an area of a side of the cavity close to the common layer.

13. The manufacturing method according to claim 12, wherein the at least one side surface of the cavity comprises a first side surface, a second side surface, and a third side surface that are sequentially connected with each other, the first side surface and the second side surface intersecting at a first intersecting line, the first side surface extends from the first intersecting line in the direction facing away from the substrate to a surface of the first functional layer facing away from the substrate, and the first side surface of the cavity is a side wall of the first opening.

14. The manufacturing method according to claim 13, wherein the display panel further comprises a second functional layer and a third functional layer that are located in the first non-display area,
wherein said forming the protruding portion comprises forming the third functional layer, an intermediate layer, and the second functional layer on a same side of the substrate, wherein the third functional layer, the intermediate layer, and the second functional layer are stacked, the second functional layer is located at a side of the intermediate layer facing away from the substrate, the third functional layer is located at a side of the intermediate layer close to the substrate, and the intermediate layer has a thickness greater than a thickness of the common layer;
wherein forming the first opening at a side of the protruding portion facing away from the substrate comprises patterning the first functional layer and the second functional layer to form the first opening penetrating the first functional layer and a second opening penetrating the second functional layer respectively, wherein an area of an orthogonal projection of the first opening on a plane of the substrate is smaller than an area of an orthogonal projection of the second functional layer on the plane of the substrate, and an area of an orthogonal projection of the second opening on the plane of the substrate is smaller than the area of the orthogonal projection of the second functional layer on the plane of the substrate; and
wherein forming, in the protruding portion, the cavity that communicates with the first opening and the second opening comprises removing the intermediate layer through the first opening and the second opening to form the cavity, wherein the cavity is located between the second functional layer and the third functional layer and is defined by the first functional layer.

15. The manufacturing method according to claim 14, further comprising: forming a driving circuit layer at a side of the substrate, wherein the driving circuit layer is located in the display area and comprises a thin transistor and a passivation layer, wherein the thin transistor comprises a source and a drain that are formed in a same layer and are made of a same material, and the passivation layer is located at a side of the source facing away from the substrate,
wherein the first functional layer and the passivation layer are formed in a same layer and are made of a same material; and the second functional layer, the third functional layer, the intermediate layer and the source are formed by a same patterning process.

16. The manufacturing method according to claim 14, wherein the first opening is located in the first functional layer, and the second opening is located in the second functional layer;
wherein said patterning the first functional layer and the second functional layer to form the first opening penetrating the first functional layer and the second opening penetrating the second functional layer respectively comprises:
patterning the first functional layer to form the first opening penetrating the first functional layer; and
patterning the second functional layer to form the second opening penetrating the second functional layer, wherein the first opening and the second opening are formed by a same etching process, and an orthogonal projection of the first opening on the plane of the substrate is overlapped with an orthogonal projection of the second opening on the plane of the substrate.

17. The manufacturing method according to claim 14, wherein said patterning the first functional layer and the second functional layer to form the first opening penetrating the first functional layer and the second opening penetrating the second functional layer respectively comprises:
patterning, by using dry etching, the first functional layer and the second functional layer to form the first opening penetrating the first functional layer and the second opening penetrating the second functional layer respectively;
wherein said removing the intermediate layer through the first opening and the second opening to form the cavity comprises:
removing, by using wet etching, the intermediate layer through the first opening and the second opening to form the cavity.

18. The manufacturing method according to claim 14, further comprising:
forming an organic layer at a side of the protruding portion facing away from the substrate, wherein the organic layer is located between the first functional layer and the common layer and is in contact with the common layer;

wherein the manufacturing method further comprises, after forming the first functional layer at a side of the patterned second functional layer facing away from the substrate, and prior to patterning the first functional layer and the second functional layer to form the first opening penetrating the first functional layer and the second opening penetrating the second functional layer respectively:

forming the organic layer covering the first functional layer, wherein a surface of the organic layer facing away from the third functional layer is parallel with the plane of the substrate; and patterning the organic layer to form a third opening penetrating the organic layer, wherein an orthogonal projection of the third opening on the plane of the substrate is overlapped with the orthogonal projection of the first opening on the plane of the substrate.

19. A display device, comprising: the display panel according to claim 7.

20. The display panel according to claim 7, further comprising a second functional layer located in the first non-display area, wherein the second functional layer is located in the cavity and is attached to the first functional layer.

21. The display panel according to claim 20, further comprising an organic layer located in the first non-display area, wherein the organic layer is located between the first functional layer and the common layer and is in contact with the common layer, and a surface of the organic layer facing away from the substrate is parallel with a plane of the substrate.

* * * * *